United States Patent
Sakai et al.

(10) Patent No.: US 7,057,293 B2
(45) Date of Patent: Jun. 6, 2006

(54) STRUCTURE COMPRISING A PRINTED CIRCUIT BOARD WITH ELECTRONIC COMPONENTS MOUNTED THEREON AND A METHOD FOR MANUFACTURING THE SAME

(75) Inventors: Hiroshi Sakai, Tokyo (JP); Motoji Suzuki, Tokyo (JP); Makoto Igarashi, Niigata (JP); Akihiro Tanaka, Niigata (JP)

(73) Assignee: NEC Corporation, Tokyo (JP)

( * ) Notice: Subject to any disclaimer, the term of this patent is extended or adjusted under 35 U.S.C. 154(b) by 46 days.

(21) Appl. No.: 10/158,191

(22) Filed: May 31, 2002

(65) Prior Publication Data

US 2002/0179323 A1 Dec. 5, 2002

(30) Foreign Application Priority Data

Jun. 1, 2001 (JP) ......................................... 2001-167065

(51) Int. Cl.
  *H01L 23/48* (2006.01)
  *H01L 23/52* (2006.01)
  *H01L 29/40* (2006.01)

(52) U.S. Cl. ...................................................... 257/779
(58) Field of Classification Search ................. 257/737, 257/738, 773, 775, 779, 780, 781; 361/743, 361/767, 808; 174/257, 260; 228/179.1, 208, 228/180.21, 180.22; 29/839–844, 832, 854, 29/860, 857
See application file for complete search history.

(56) References Cited

U.S. PATENT DOCUMENTS

| | | | | |
|---|---|---|---|---|
| 5,311,405 A | * | 5/1994 | Tribbey et al. | 361/767 |
| 5,446,247 A | * | 8/1995 | Cergel et al. | 174/267 |
| 6,296,174 B1 | | 10/2001 | Chiang | |
| 2002/0185304 A1 | * | 12/2002 | Sakai et al. | 174/257 |

FOREIGN PATENT DOCUMENTS

| | | | |
|---|---|---|---|
| JP | 2-39484 | | 2/1990 |
| JP | 02039484 | * | 2/1990 |
| JP | 10-70359 | | 3/1998 |
| JP | 10070359 | * | 3/1998 |
| JP | 2001-77522 | | 3/2001 |
| JP | 2001077522 | * | 2/2004 |

OTHER PUBLICATIONS

Taiwanese Office Action dated Nov. 7, 2003 wtih English translation of pertinent portions.
Japanese Copyright 2003 APIPA dated Sep. 26, 1994.
Abstract pf the Disclosure.
European Search Report dated Apr. 1, 2004.
Vincent et al., "Lead–Free Solders for Electronic Assembly"; The GEC Journal of Research; vol. 11, No. 2;1 1994; pp. 76–89.
XP–002275694 & TW362342A (Sony Video Taiwan Co. Ltd.); Jun. 21, 1999; 1 p.

* cited by examiner

*Primary Examiner*—David A. Zarneke
(74) *Attorney, Agent, or Firm*—Whitman, Curtis & Christofferson, PC (57) ABSTRACT

A structure of the present invention has a printed circuit board having a land portion provided on a surface thereof on which a solder paste is printed in such a condition that, with respect to a lengthwise direction of a connecting terminal of an electronic component to be connected to the land portion, the solder paste projects outward from an edge of the land portion on the side of a front end of the connecting terminal and/or the solder paste is withdrawn toward inside the edge of the land portion on the side of a rear end of the connecting terminal. Solder projecting from the edge of the land portion on the side of the front end of the connecting terminal is used for forming a fillet by which the front end of the connecting terminal is surely covered. Also, as the solder paste is withdrawn from the edge of the land portion on the side of the rear end of the connecting terminal, any extra solder except for the solder indispensable for forming a soldered joint is not generated.

6 Claims, 8 Drawing Sheets

STRUCTURE COMPRISING A PRINTED CIRCUIT BOARD WITH ELECTRONIC COMPONENTS MOUNTED THEREON AND A METHOD FOR MANUFACTURING THE SAME

BACKGROUND OF THE INVENTION

1. Field of the Invention

The present invention relates to a structure obtained by mounting various electronic components on a printed circuit board (it will be usually referred to as a PCB) by soldering and a method for manufacturing the same. More particularly, it relates to a structure in which the electronic components are mounted on the PCB by reflowing, and a method for manufacturing the same.

2. Description of the Related Art

Hitherto, soft soldering is employed for fixedly mounting electronic components on a PCB. A description of an example of the method of mounting electronic components by the use of a soft solder is provided hereinbelow with reference to FIG. 1. Here, the description of a case where soldering is applied by the known reflowing technique to both surfaces of the PCB, respectively, will be provided.

Figure 1:
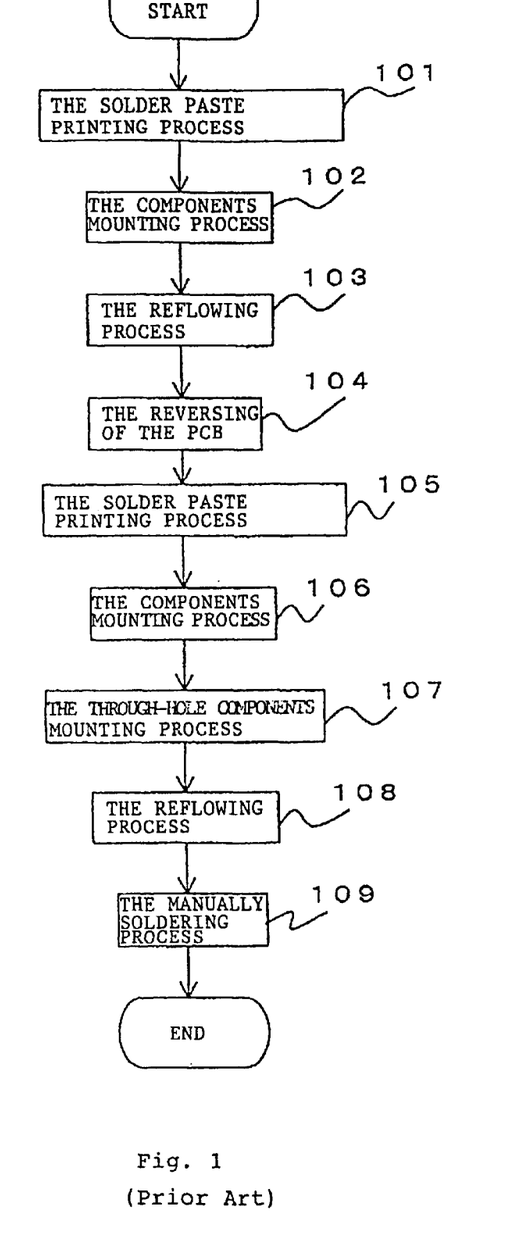
FIG. 1 is a flow chart indicating an example of the mounting method of electronic components, in which the electronic components are mounted by the employment of a solder.

First, a metal mask provided with apertures at only the corresponding positions to land portions of the PCB is used for printing solder paste on the land portions (Step 101). Subsequently, electronic components such as chips, QFP (Quad Flat Package), SOP (Small Outline Package) and so on are mounted on the PCB, so that the electric terminals and leads of these electronic components are mounted onto the printed solder paste (Step 102). Thereafter, the PCB mounting thereon the electronic components is urged to pass through a high-temperature reflowing furnace so as to fuse the solder paste thereby soldering the electrodes of the electronic components to the land portions of the PCB (Step 103).

The described process permits completion of the mounting of the electronic components onto one of both surfaces of the PCB. Therefore, the PCB is subsequently reversed so that the other surface mounting thereon no electronic components is held upward (Step 104).

Subsequently, similarly to the described Steps 101 and 102, the printing of the solder paste (Step 105) and mounting of the electronic components (Step 106) are implemented. Thereafter, the components having their electric leads are inserted in the through-holes (Step 107). Then, similarly to the Step 103, the PCB is urged to pass through the furnace so as to complete the soldering of the components (Step 108).

Finally, some electronic components that are not able to withstand a high temperature in the reflowing furnace are subjected to the process of manually soldering these components to thereby complete mounting of the electronic components onto the PCB (Step 109).

In the above-described mounting method of the electronic components according to the known technology, solder paste containing therein solder of tin and lead (Sn—Pb) is generally used. However, since the Sn—Pb solder contains therein lead (Pb) that is a toxic heavy metal, unless electronic appliances after usage are adequately put on the discard, there has occurred such a problem that an adverse affect is provided on the global atmosphere. Taking this into consideration, in recent years, in order to solve the described problem to thereby prevent any environmental pollution from occurring beforehand, employment of a Pb-free solder containing therein no lead component is eagerly desired.

In this respect, a tin and silver (Sn—Ag) type solder is typically known as the Pb-free solder. Since the property of the silver (Ag) is stable, when the Sn—Ag type solder is used for mounting the electronic components in lieu of the Sn—Pb type solder, it can ensure identical degree of reliability with the conventional mounting method. Nevertheless, compared with the melting point of the Sn—Pb type solder being about 183° C., the melting point of the Sn—Ag type solder higher being about 220° C. Therefore, the conventional mounting apparatus and method having employed the Sn—Pb type solder cannot be directly applied when the Sn—Ag type solder is employed.

If the Sn—Ag type solder having the melting point of as high as 220° C. is fused in the reflowing furnace to implement the soldering of the electronic components, the temperature of the components could occasionally be more than 240° C. Since the heatproof temperature of the electronic components is usually approximately 230° C., when the Sn—Ag type solder is employed for mounting the electronic components, such a problem will be encountered that the heatproof temperature of various sorts of electronic components should be raised.

There is another Pb-free solder different from the Sn—Ag type solder having the above-mentioned high melting point, i.e., a tin-Zinc (Sn—Zn) type solder. Since the melting point of the Sn—Zn type solder is approximately 197° C., when the Sn—Zn type solder is employed for the mounting of electronic components, the conventional equipment and electronic components can be directly employed without any changes to them.

Nevertheless, when the Sn—Zn type solder is compared with the conventionally employed Sn—Pb type solder, there are problems such that the Zinc (Zn) is apt to be oxidized, and the wettability of the Sn—Zn type solder is rather poor. Accordingly, when the mounting of the electronic components is conducted by the direct use of the conventional equipment and the conventional mounting method, it cannot be ensured that the mounting reliability is equivalent to the conventional one.

At this stage, a description of comparison between the mounting of electronic components implemented by the use of the Sn—Pb type solder and that implemented by the use of the Sn—Zn type solder will be provided below.

Figure 2A:
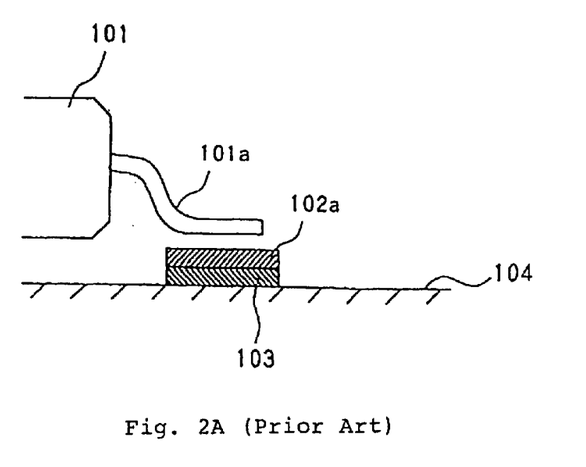
FIGS. 2A through 2C are schematic cross-sectional views illustrating a manner in which, according to the prior art, a lead of a QFP that is an electronic component is connected to a land on a board by the employment of a Sn—Pb type solder.
Figure 2B:
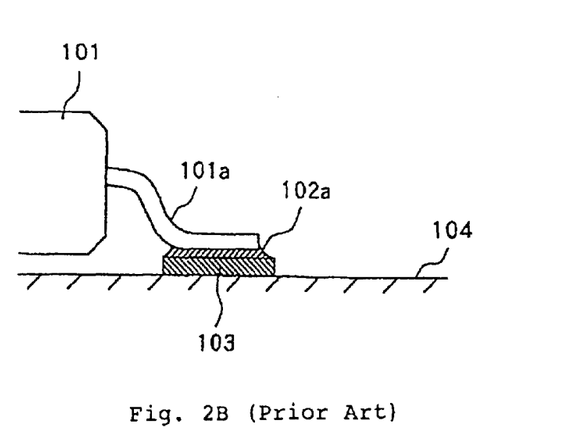
Figure 2C:
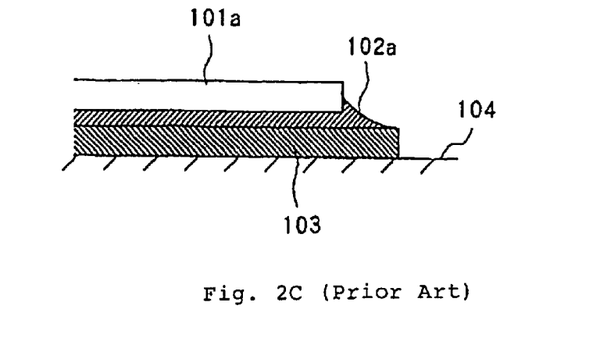

FIGS. 2A through 2C are schematic cross-sectional views illustrating a manner in which the lead of a QFP that is an electronic component is electrically connected to the land of a board by the employment of the Sn—Pb type solder. FIG. 2A illustrates the lead of the QFP before it is connected to the land of the board, FIG. 2B illustrates the lead of the QFP after it is connected to the land of the board, and FIG. 2C illustrates, in an enlarged scale, the fillet of the Sn—Pb type solder provided at the extreme end of the lead illustrated in FIG. 2B.

As illustrated in FIGS. 2A through 2C, a wiring pattern is produced on board 104 by a copper foil or the like, and a part of the produced pattern is formed in land 103 to which the electric lead terminals of various sorts of electronic components are electrically connected. Onto land 103, a solder paste containing therein the Sn—Pb type solder for electrically jointing and connecting the terminals of the electronic component is printed. At this stage, the wiring pattern on board 104 is covered by a layer of an insulative resist, and land 103 is formed by removing the resist layer at a portion of the wiring pattern. However, it is noted that the instant figures and the other drawings are schematic views for omitting the resist layer.

Here, the above-mentioned printing process of the solder paste will be described with reference to FIGS. 3A through 3C.

Figure 3A:
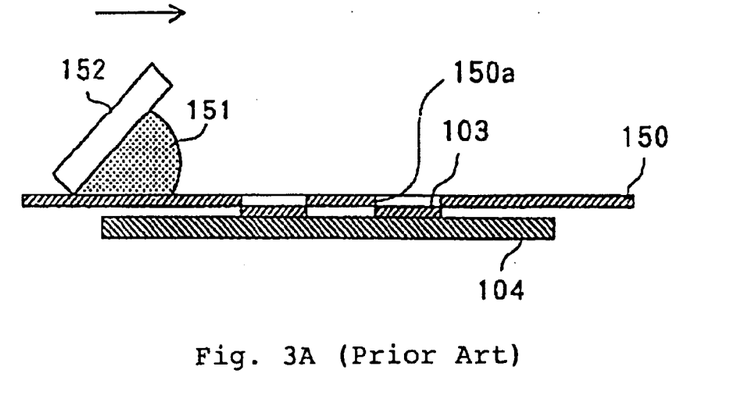
FIGS. 3A through 3C are views illustrating a printing process of a solder paste.

First, as illustrated in FIG. 3A, printing mask 150 is mounted and positioned onto board 104, so that respective apertures 150a of printing mask 150 are corresponding to respective lands 103. Subsequently, a predetermined amount of solder paste 151 is placed on printing mask 150 mounted on board 104, and as illustrated in FIG. 3B, squeegee 152 is employed for urging solder paste 151 to perform rolling and moving over the surface of printing mask 150 from an end thereof to the opposite end.

In the course of rolling and moving of solder paste 151 over the surface of printing mask 150, paste 151 is impressed into respective apertures 150a by means of squeegee 152, so as to fill up apertures 150a. Then, as illustrated in FIG. 3C, when printing mask 150 is separated away from board 104, a predetermined amount of solder paste 151 is printed on each of lands 103 of board 104, and thus the printing process of the solder paste is terminated.

Thereafter, by way of the above-mentioned component mounting process and reflowing process, when lead 101a of QFP 101 is soldered to land 103 (refer to FIG. 2B), fillet is formed at front and rear ends of lead 101a laid on land 103 by the action of the surface tension of Sn—Pb type solder 102a per se (refer to FIG. 2C). At this time, lead 101a is covered by a sufficient amount of the solder fillet, i.e., generally, one third or more in thickness of the lead is covered. Thus, the strength of joint of lead 101a to land 103 can be acquired.

Figure 4A:
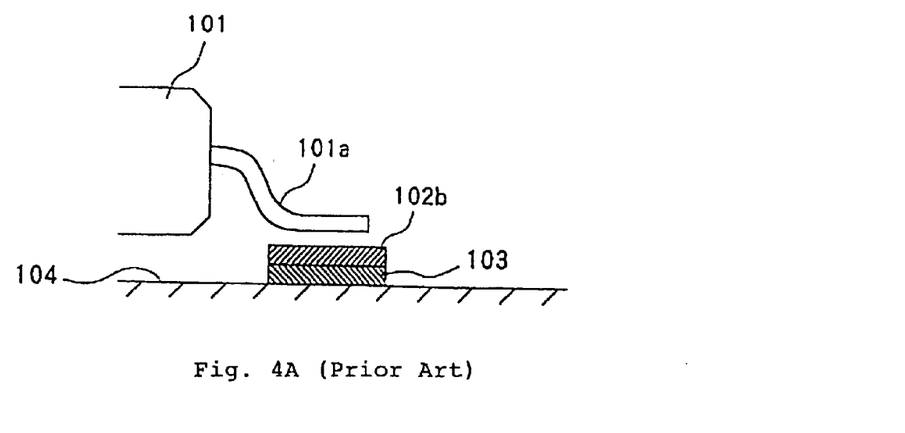
FIGS. 4A through 4C are schematic cross-sectional views illustrating a manner in which, according to the prior art, a lead of a QFP that is an electronic component is connected to a land on a board by the employment of a Sn—Zn type solder.
Figure 4B:
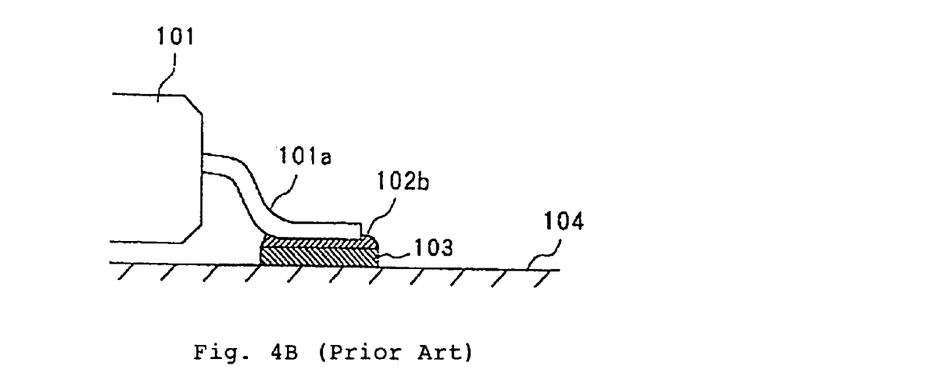
Figure 4C:
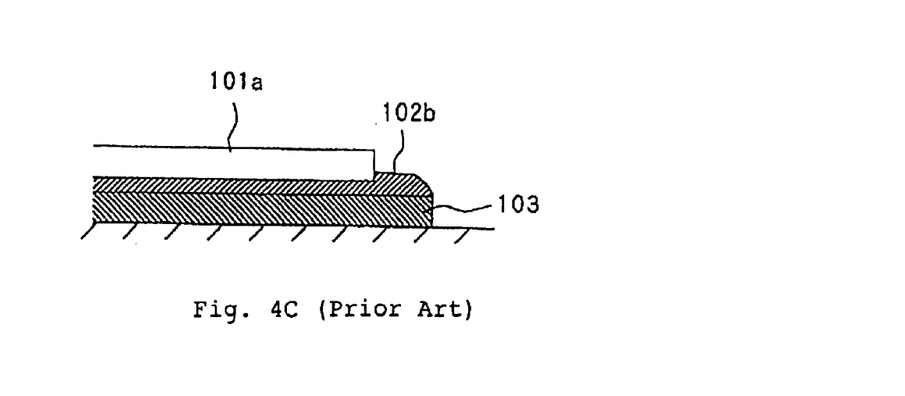

FIGS. 4A through 4C are schematic cross-sectional views illustrating a manner in which the lead of a QFP that is an electronic component is electrically connected to the land on the board by the use of a Sn—Zn type solder which is different from the example of FIGS. 2A through 2C.

FIG. 4A illustrates the lead of the QFP in a state before it is connected to the land of a board, FIG. 4B illustrates the lead of the QFP in a state after it is connected to the land of a board, and FIG. 4C illustrates, in an enlarged scale, the fillet of the Sn—Zn type solder provided at the extreme end of the lead shown in FIG. 4B.

In the present example, when lead 101a of QFP 101 is soldered to land 103 (refer to FIG. 4B) by way of the afore-mentioned printing process, component mounting process, and reflowing process, the fillet is formed, by the surface tension of Sn—Zn type solder 102b per se, at the front and rear ends of lead 101a laid on land 103 (refer to FIG. 4C). Nevertheless, since Sn—Zn type solder 102b is poor in its wettability as described before, lead 101a cannot be covered by a sufficient amount of solder fillet (generally, equal to or more than one third of the thickness of the lead), and therefore sufficient strength of joint of lead 101a to land 103 cannot be acquired. As a result, either a defective joint or a breakage of the joint could occur between lead 101a and land 103.

Figure 5A:
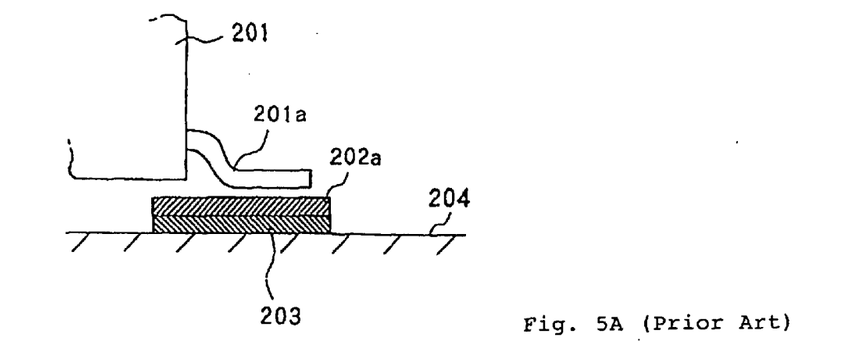
FIGS. 5A and 5B are schematic cross-sectional views illustrating a manner in which, according to the prior art, a lead of a connector component that is an electronic component is connected to a land on a board by the employment of a Sn—Pb type solder.
Figure 5B:
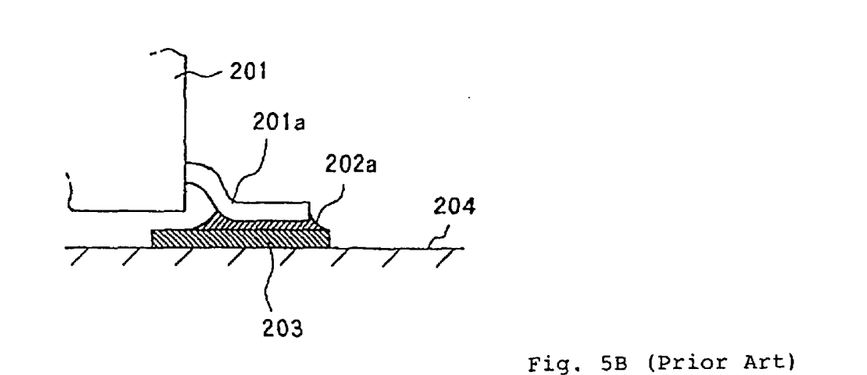

Further, FIGS. 5A and 5B illustrate a manner in which an electric lead of a connector component that is an electronic component is connected to the land of a board according to the prior art by the employment of the Sn—Pb type solder. FIG. 5A illustrates the lead of the connector component in a state before it is connected to the land on the board, and FIG. 5B illustrates the lead of the connector component in a state after it is connected to the land of the board.

In the present example, similar to the example shown in FIGS. 2A through 2C, a wiring pattern is produced on board 204 by the use of a copper foil or the like, and a portion of the produced pattern is formed as a land 203 to which the lead terminals of various electronic components are connected to form electric joints. On such land 203, solder paste containing therein Sn—Pb type solder 202a for connecting the terminals of the electronic components is printed.

By way of the afore-described printing process, component mounting process, and reflowing process, when lead 201a of connector component 201 is soldered to land 203 (refer to FIG. 5B), fillets are formed, by the surface tension of Sn—Pb solder per se, at the front and rear ends of lead 201a laid on land 203. Thus, similar to the example of FIGS. 2A through 2C, the joint strength of lead 201a to land 203 can be acquired.

Figure 6A:
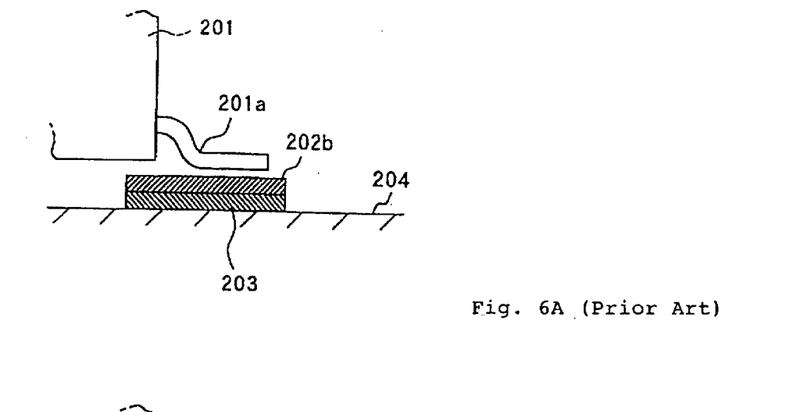
FIGS. 6A and 6B are schematic cross-sectional views illustrating a manner in which, according to the prior art, a lead of a connector component that is an electronic component is connected to a land on a board by the employment of a Sn—Zn type solder.
Figure 6B:
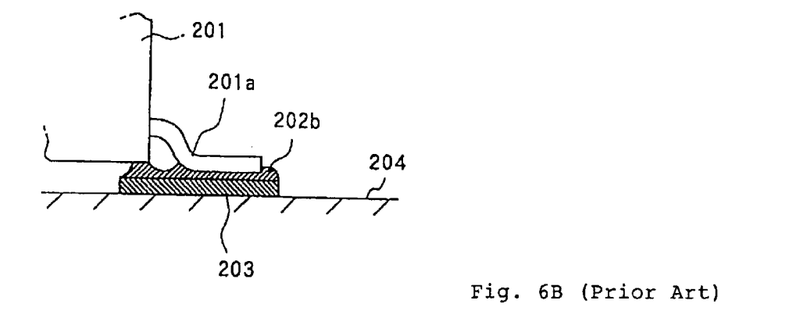

FIGS. 6A and 6B, differing from FIGS. 5A and 5B, are schematic cross-sectional views illustrating a manner in which the lead of a connector component that is an electronic component is connected to the land of a board by the employment of the Sn—Zn type solder. FIG. 6A illustrates the lead of the connector component in a state before it is connected to the land of the board, and FIG. 6B illustrates the lead of the connector component in a state after it is connected to the land of the board.

In the present example, when lead 201a of connector component 201 is soldered to land 203 (refer to FIG. 6B) by way of the afore-described printing process, component mounting process and reflowing process, fillet is formed by the surface tension of Sn—Zn type solder 202b per se at the front and rear ends of lead 201a laid on land 203. Nevertheless, since Sn—Zn type solder 202b is poor in its wettability as described before, lead 201a cannot be covered by a sufficient amount of solder fillet (generally, equal to or more than one third of the thickness of the lead), and accordingly the strength of joint of lead 201a to land 203 cannot sufficiently be acquired.

Also, in the case of connector component 201, since a difference in the height between the lower face of the body of connector component 201 and the lower face of lead 201a is generally small, and since a portion of that body per se lies above and covers a portion of land 203, when connector component 201 is mounted on board 204, as shown in FIG. 6B, a part of Sn—Zn type solder 202b might unfavorably attach to the lower face of the body of connector component 201.

In the case of the Sn—Pb type solder (refer to FIGS. 5A and 5B), as the wettability thereof is rather high, the solder existing below the body of the connector component would move to a position adjacent to the rear end of the lead for forming the solder fillet. However, in the case of the Sn—Zn type solder, the wettability thereof is low or poor, and accordingly the solder existing below the body of the connector component does not move too much and stays there resulting in that it is sandwiched between the body of connector component 201 and land 203.

Figure 7:
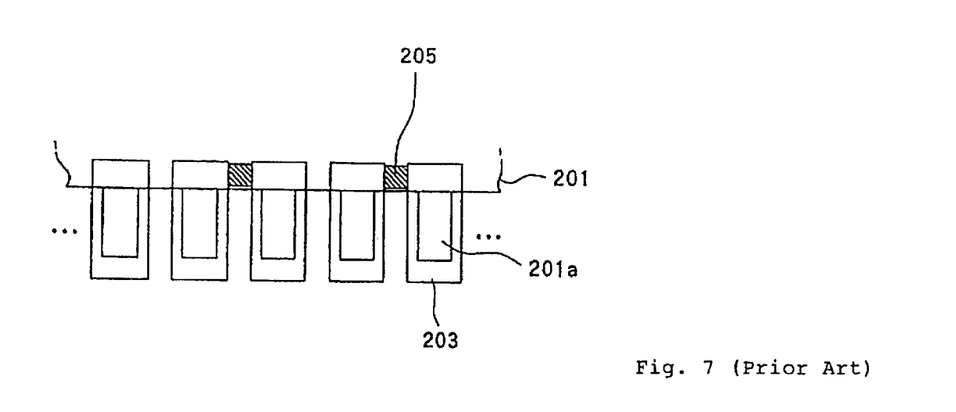
FIG. 7 is a perspective plan view illustrating the constitution of FIG. 6B

FIG. 7 is a perspective plan view of the constitution as shown in FIG. 6B.

As described above, due to the low wettability of the solder, Sn—Zn type solder 202b sandwiched between the body of connector component 201 and land 203 would overflow into a space between the neighboring lands 203, and occasionally a bridge 205 of the solder might be formed so as to short-circuit between the neighboring lands 203. To the contrary, in the case of the Sn—Pb type solder, the wettability thereof is better, and accordingly the solder bridge is not formed at all.

Thus, if the solder joint of the electronic component by the employment of the Sn—Zn type solder is applied in a manner similar to that of application of the solder joint by the employment of the conventional Sn—Pb type solder, it has been clarified that some defects as described above must be met by the cause of the low or poor wettability of the Sn—Zn type solder.

SUMMARY OF THE INVENTION

An object of the present invention is to provide a structure comprising a printed circuit board with electronic components mounted thereon with being acceptably soldered even when a solder having poor wettability such as a Sn—Zn type solder is employed, and a method for manufacturing the same.

In accordance with an embodiment of the present invention, a structure of the present invention includes a printed circuit board having a land portion provided on a surface thereof on which a solder paste is printed in such a condition that, with respect to a lengthwise direction of a connecting terminal of an electronic component to be connected to said land portion, the solder paste projects outward from an edge of said land portion on the side of a front end of said connecting terminal and/or the solder paste is withdrawn toward inside the edge of said land portion on the side of a rear end of said connecting terminal.

In accordance with another embodiment of the present invention, a method for manufacturing a structure includes printing of a solder paste on a land portion provided on a surface of a printed circuit board in such a condition that, with respect to a lengthwise direction of a connecting terminal of an electronic component to be connected to said land portion, the solder paste is projected outward from an edge of said land portion on the side of a front end of said connecting terminal and/or the solder paste is withdrawn toward inside the edge of said land portion on the side of a rear end of said connecting terminal.

As will be understood from the above-description of the present invention, since the solder paste is provided so as to project outward from the edge of the land portion on the side of the front end of the connecting terminal, when fillet of the solder is formed on the side of the front end of the connecting terminal during a reflowing process, a portion of the solder, which projects from the edge of the land portion, also contributes to the formation of the fillet. Thus, an amount of solder that is employed for forming of the fillet on the side of the front end of the connecting terminal can be more than that conventionally employed. Therefore, even if a solder material contained in the solder paste is poor in its wettability, the formed fillet of the solder can surely cover the front end portion of the connecting terminal, and accordingly sufficient strength of soldered joint of the connecting terminal to the land portion can be acquired.

Also, since the solder paste is provided so as to be withdrawn toward inside the edge of the land portion on the side of the rear end of the connecting terminal, it is possible to suppress generation of any extra amount of solder except for the solder that is indispensable for jointing the connecting terminal to the land portion on the side of a rear end of the connecting terminal. As a result, for example, when a mounted electronic component is provided with a body having the lower face thereof from which a difference in a height to the lower face of a connecting terminal is small, and when a portion of the body is arranged so as cover a portion of the land portion, there is little possibility of occurrence that the solder is sandwiched between the body and the land portion, and additionally, it is possible to suppress forming of a solder bridge by the overflowing of the solder into a space between any neighboring land portions.

The solder contained in the afore-mentioned solder paste may be a Sn—Zn type solder, which does not contain any lead component (Pb).

In accordance with a further embodiment of the present invention, a printing mask of the present invention is formed in such a manner that, when the printing mask is mounted in a condition to be positioned at a predetermined position on a printed circuit board, with respect to a lengthwise direction of a connecting terminal of an electronic component to be connected to the land portion, an edge of an aperture of the printing mask used for printing a solder paste on the land portion of the printed circuit board is located outside an edge of the land portion on the side of a front end of said connecting terminal, and/or, the edge of the aperture is located inside the edge of said land portion on the side of a rear end of said connecting terminal.

According to the above-constructed printing mask of the present invention, with respect to the lengthwise direction of the connecting terminal of the electronic component connected to the land portion, the solder paste is printed in a condition such that it projects outward from the edge of the land portion on the side of the front end of the connecting terminal, and is withdrawn toward inside the edge of the land portion on the side of the rear end of the connecting terminal. Therefore, even when a solder having poor wettability such as a Sn—Zn type solder is employed, the soldered joint of the electronic component can be acceptably and successfully implemented.

In accordance with a still further embodiment of the present invention, a printing method of the present invention prints, by the employment of the above-mentioned printing mask of the present invention, a solder paste on a land portion of a printed circuit board.

The above and other objects, features, and advantages of the present invention will become apparent from the following description with reference to the accompanying drawings, which illustrate examples of the present invention.

DESCRIPTION OF THE PREFERRED EMBODIMENTS (A First Embodiment)

Figure 8A:
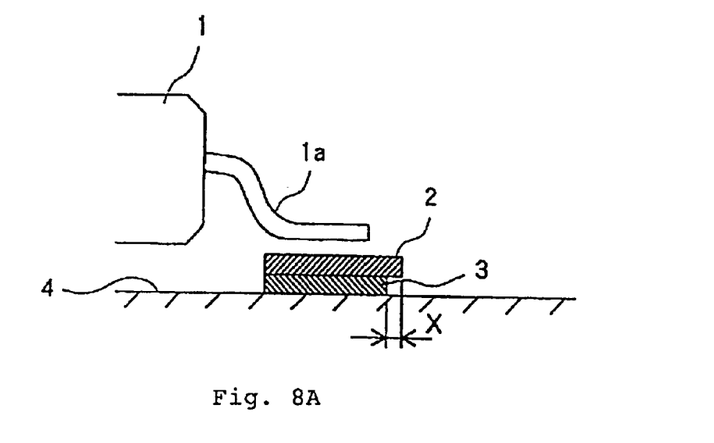
FIGS. 8A through 8C are schematic cross-sectional views illustrating a manner in which, according to a first embodiment of the present invention, a lead of a QFP that is an electronic component is connected to a land on a board by the employment of a Sn—Zn type solder, which is a Pb-free solder.
Figure 8B:
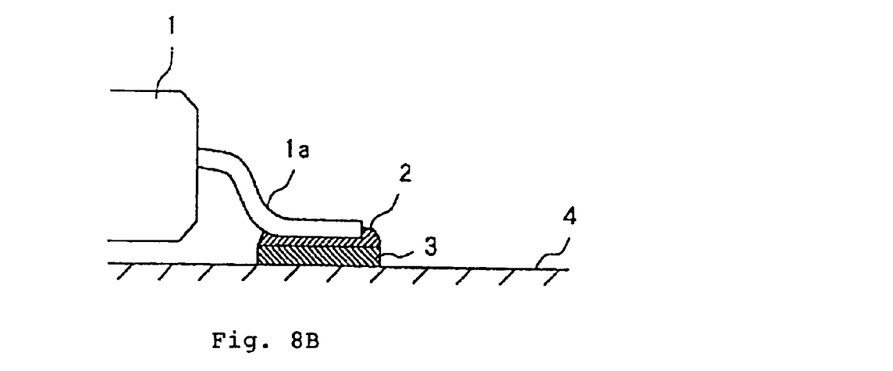
Figure 8C:
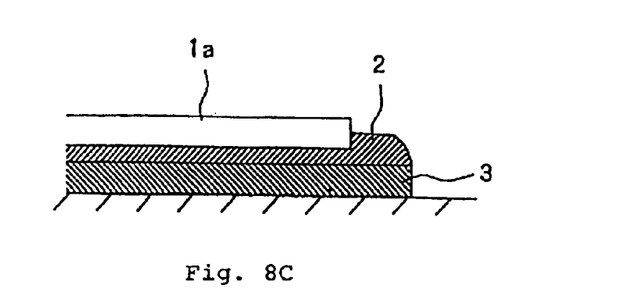

FIGS. 8A through 8C are schematic cross-sectional views illustrating a manner in which, according to a first embodiment of a method for manufacturing a structure of the present invention, a lead of a QFP that is an electronic component is connected to a land on a board by the employment of a Sn—Zn type solder, which is a Pb-free solder. FIG. 8A illustrates the lead of the QFP in a condition before it is connected to the land on the board, FIG. 8B illustrates the lead of the QFP in a condition after it is connected to the land on the board, and FIG. 8C illustrates, by an enlarged scale, a fillet of the Sn—Zn type solder provided at the front end of the lead, as shown in FIG. 8B.

As illustrated in FIG. 8A, a wiring pattern is produced on board 4 by a copper foil or the like, and a portion of the produced pattern forms land 3 to which lead terminals of various electronic components are connected. Further, on such land 3, a solder paste containing therein Sn—Zn type solder 2 for connecting the terminals of the electronic component is printed. In the present embodiment, Sn—Zn type solder 2 printed on land 3 projects from an edge of land 3 by a length X on the side of a front end of a lengthwise direction of lead 1a connected to land 3. The length X could be, for example, approximately 0.1 mm. On the other hand, on the side of the rear end in the lengthwise direction of lead 1a, the edge of Sn—Zn type solder 2 is corresponding to the edge of land 3.

Figure 3B:
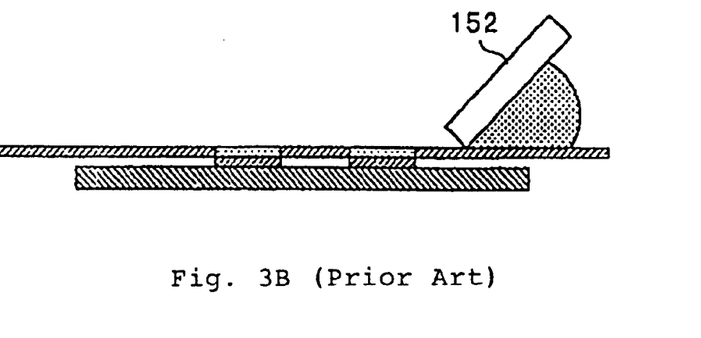
Figure 3C:
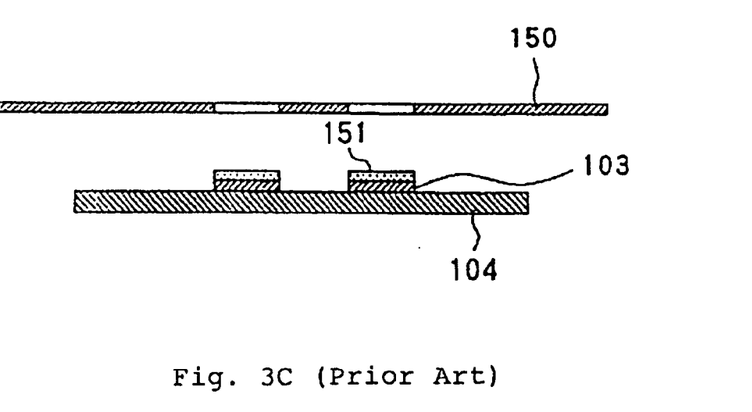

It should be noted that in the present embodiment, the printing of the solder paste on land 3 is implemented by the printing process as described in reference to FIGS. 3A through 3C. However, the printing mask used in the present embodiment is formed in a manner such that when the mask is mounted in a condition to be positioned at a predetermined position on board 4, an edge of an aperture thereof is located outside the edge of land 3 on the side of the front end of lead 1a to be connected to land 3, with respect to a lengthwise direction of lead 1a.

When lead 1a of QFP 1 is soldered to land 3 by way of the afore-mentioned printing process, component-mounting process, and reflowing process (refer to FIG. 8B), a fillet is formed at the front and rear ends of lead 1a laid on land 3, by the surface tension of Sn—Zn type solder 2 per se (refer to FIG. 8C).

A portion of Sn—Zn type solder 2, which projects from the edge of land 3 is also fused during the reflowing process, and is moved toward the front end of lead 1a by the surface tension of the solder per se so as to form the above-mentioned fillet. Therefore, an amount of the solder existing around the front end of lead 1a is more than that in the case shown in FIGS. 4A through 4C, and accordingly even if Sn—Zn type solder 2 is employed, the front end of lead 1a is covered by a sufficient amount of fillet (generally, equal to or more than one third of the thickness of the lead), so that acceptable strength of joint of lead 1a to land 3 can be acquired.

In the foregoing, although a specified example of using QFP as an electronic component has been described, application of the present embodiment is not limited to only the QFP. Thus, the present embodiment may be applied to another electronic component, for example, SOP.

(The Second Embodiment)

Figure 9A:
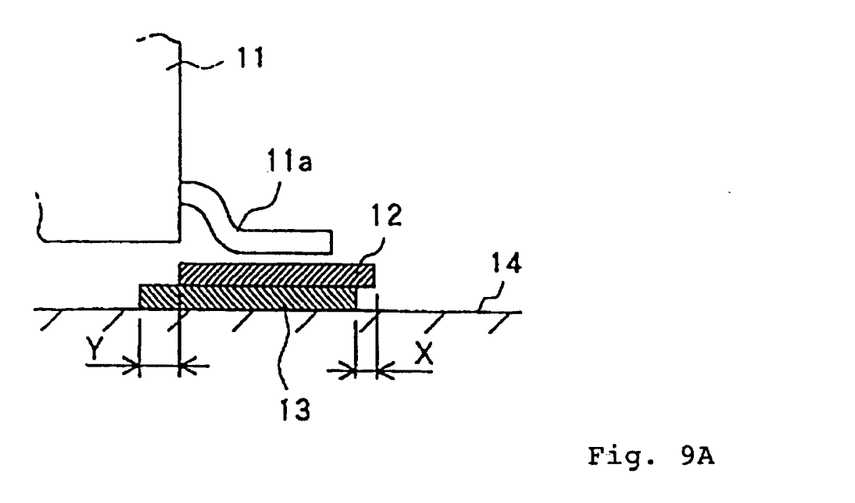
FIGS. 9A and 9B are schematic cross-sectional views illustrating a manner in which, according to a second embodiment of the present invention, a lead of a connector component that is an electronic component is connected to a land on a board by the employment of a Sn—Zn type solder, which is a Pb-free solder.
Figure 9B:
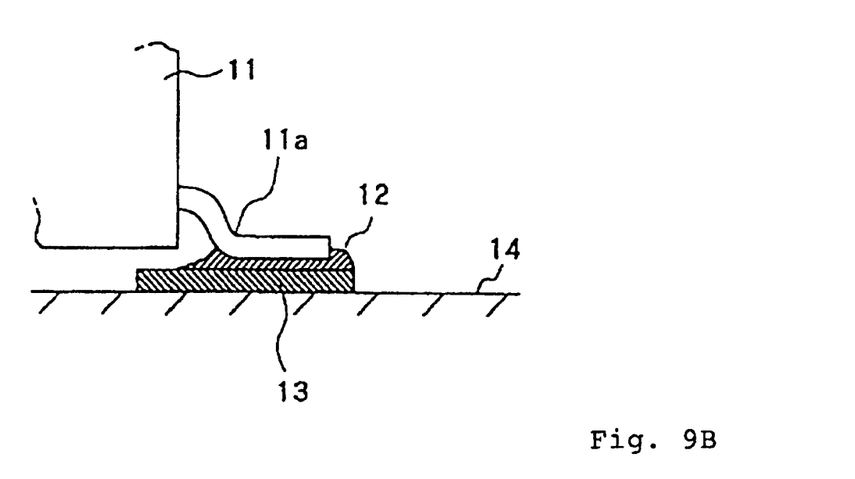

FIGS. 9A and 9B schematically illustrate a manner in which, according to the second embodiment of a method for manufacturing a structure of the present invention, a lead of a connector component that is an electronic component is connected to the land on a board, by the employment of a Sn—Zn type solder, which is a Pb-free solder. FIG. 9A illustrates the lead of the connector component in a state before it is connected to the land on the board, and FIG. 9B illustrates the lead of the connector component in a state after it is connected to the land on the board.

In the present embodiment too, as shown in FIG. 9A, a solder paste containing therein Sn—Zn type solder 12 for connecting an electronic component is printed on land 13 formed on board 14. In the present embodiment, on the side of the front end in the lengthwise direction of lead 11a to be connected to land 13, Sn—Zn type solder 12 printed on land 13 is provided so as to project outward from the edge of land 13 by a length X. The length X could be, for example, approximately 0.1 mm. On the other hand, on the side of the rear end in the lengthwise direction of lead 11a, Sn—Zn type solder 12 is provided so as to be withdrawn toward inside the edge of land 13 by a length Y. The length Y could be, for example, approximately 0.2 mm.

At this stage, in the present embodiment too, the printing of solder paste to land 13 is implemented by the printing process as described in reference to FIGS. 3A through 3C. However, the mask used in the present embodiment is formed in a manner such that, when the mask is mounted in such a condition that it is positioned at a predetermined position on board 14, the edge of an aperture thereof is located outside the edge of land 13 on the side of the front end of lead 11a with respect to the lengthwise direction of lead 11a to be connected to land 13, and further the edge of the aperture is located inside the edge of land 13 on the side of the rear end of lead 11a.

When lead 11a of connector component 11 is soldered to land 13 (refer to FIG. 9B), by way of the afore-described printing process, component-mounting process, and reflowing process, at the front and rear ends of lead 11a laid on land 13, a fillet is formed by the surface tension of Sn—Zn type solder 12 per se.

A portion of Sn—Zn type solder 12, which projects from the edge of land 13 on the side of the front end in the lengthwise direction of lead 11a, is also fused during the reflowing process, and is moved toward around the front end of lead 11a by the action of the surface tension of the solder per se, in order to form the above-mentioned fillet. Accordingly, an amount of the solder existing around the front end of lead 11a can be more than that in the case shown in FIGS. 6A through 6C, and thus even if Sn—Zn type solder 12 is employed, the front end portion of lead 11a can be covered by a sufficient amount of solder fillet (generally, equal to or more one third of the thickness of the lead), so that acceptable strength of joint of lead 11a to land 13 can be acquired.

On the other hand, Sn—Zn type solder 12 is withdrawn from the edge of land 13 by a length Y on the side of the rear end in the lengthwise direction of lead 11a, and accordingly an amount of the solder existing below the body of connector component 11 is less than that in the example shown in FIGS. 6A and 6B. Therefore, it is possible to reduce a possibility that solder 2 is sandwiched between the body of connector component 11 and land 13, and as a result, formation of the solder bridge as shown in FIG. 7 can be suppressed.

While preferred embodiments of the present invention have been described using specific terms, such description is for illustrative purpose only, and it is to be understood that changes and variations may be made by a person skilled in the art without departing from the provided spirit or scope of the following claims.

What is claimed is:

1. A structure comprising:

a printed circuit board having a land portion provided on a surface thereof on which a connecting terminal of an electronic component is connected in a manner such that, with respect to a lengthwise direction of said connecting terminal, a solder paste comprising a Sn-Zn type solder than does not contain therein any Pb is printed on the entire surface area of said land portion in a condition to project from an edge of said land portion on the side of a front end of said connecting terminal; and an electronic component mounted on said printed circuit board.

2. A structure comprising:

a printed circuit board having a land portion provided on a surface thereof on which a connecting terminal of an electronic component, whose body is arranged to cover a part of said land portion, is connected in a manner such that, with respect to a lengthwise direction of said connecting terminal, a solder paste is printed on said land portion in a condition to project from an edge of said land portion on the side of a front end of said connecting terminal, and in a condition to be withdrawn toward the inside from said edge of said land portion and toward the inside from the region covered by the body of the electronic component on the side of a rear end of said connecting terminal; and an electronic component mounted on said printed circuit board.

3. A printing mask provided with an aperture for printing a solder paste comprising a Sn-Zn type solder that does not contain therein any Pb on a land portion of printed circuit board, wherein said aperture is formed in such manner that, when said printing mask is mounted on said printed circuit board in a condition to be positioned at a predetermined position, said aperture covers the entire surface area of said land portion, and with respect to a lengthwise direction of a connecting terminal of an electronic component to be connected to said land portion, an edge of said aperture is located outside an edge of said land portion on the side of a front end of said connecting terminal.

4. A printing mask provided with an aperture for printing a solder paste on a land portion of a printed circuit board, wherein said aperture is formed in such manner that, when said printing mask is mounted on said printed circuit board in a condition to be positioned at a predetermined position, with respect to a lengthwise direction of a connecting terminal of an electronic component whose body is arranged to cover a part of said land portion to be connected to said land portion, an edge of said aperture is located outside an edge of said land portion on the side of a front end of said connecting terminal, and is located inside the edge of said land portion and inside from the region covered by the body of the electronic component on the side of a rear end of said connecting terminal.

5. A method for printing a solder paste on a land portion of a printed circuit board by the use of the printing mask as set forth in claim 3.

6. A method for printing a solder paste on a land portion of a printed circuit board by the use of the printing mask as set forth in claim 4.

* * * * *